(12) United States Patent
Muraki et al.

(10) Patent No.: US 7,583,072 B2
(45) Date of Patent: Sep. 1, 2009

(54) CURRENT SENSOR FOR MEASURING CURRENT FLOWING THROUGH BUS BAR

(75) Inventors: Hitoshi Muraki, Aichi (JP); Hiroshi Ueno, Aichi (JP); Kenji Tanaka, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 11/670,159

(22) Filed: Feb. 1, 2007

(65) Prior Publication Data

US 2007/0200551 A1 Aug. 30, 2007

(30) Foreign Application Priority Data

Feb. 16, 2006 (JP) ............................... 2006-039293

(51) Int. Cl.
*G01R 33/07* (2006.01)
*G01R 15/18* (2006.01)
*G01R 19/20* (2006.01)

(52) U.S. Cl. ................................ 324/117 H; 324/117 R

(58) Field of Classification Search ............. 324/117 H, 324/117 R, 127
See application file for complete search history.

(56) References Cited

U.S. PATENT DOCUMENTS

| 4,473,810 | A | * | 9/1984 | Souques et al. ............. 336/115 |
| 5,227,761 | A | * | 7/1993 | Sugimoto et al. ......... 338/32 R |
| 6,005,383 | A | * | 12/1999 | Savary et al. ............ 324/117 H |
| 6,472,878 | B1 | * | 10/2002 | Bruchmann .................. 324/424 |
| 6,611,137 | B2 | * | 8/2003 | Haensgen et al. ........ 324/117 H |
| 6,896,189 | B2 | * | 5/2005 | Guion et al. ................. 235/492 |
| 2004/0080308 | A1 | * | 4/2004 | Goto ........................ 324/117 H |
| 2005/0073293 | A1 | * | 4/2005 | Hastings et al. ......... 324/117 H |
| 2006/0226826 | A1 | * | 10/2006 | Teppan ..................... 324/117 H |

FOREIGN PATENT DOCUMENTS

| JP | 5-223849 A | 9/1993 |
| JP | 8-194016 A | 7/1996 |

\* cited by examiner

*Primary Examiner*—Ha Tran T Nguyen
*Assistant Examiner*—Karen M Kusumakar
(74) *Attorney, Agent, or Firm*—Crompton, Seager & Tufte, LLC

(57) ABSTRACT

A current sensor for detecting current flowing through a conductive bus bar. A fitting groove is formed in the bus bar. A package is fitted into the fitting groove including a magnetic detection element that detects current flowing through the bus bar. A lead frame is connected to the magnetic detection element and extends out of the package. The bus bar includes a first conductor and a second conductor facing toward the first conductor, with the first and second conductors defining the fitting groove. The magnetic detection element is arranged between the first conductor and the second conductor in a state in which the package is fitted into the fitting groove.

11 Claims, 3 Drawing Sheets

CURRENT SENSOR FOR MEASURING CURRENT FLOWING THROUGH BUS BAR

BACKGROUND OF THE INVENTION

The present invention relates to a current sensor for detecting current flowing through a bus bar.

When current flows through a bus bar, such current is detected by a current sensor. In the prior art, a current sensor may be a magnetic sensor that detects the intensity of magnetic fields produced by the current flowing through the bus bar. Such a current sensor includes a core that attracts detectable flux.

To simplify the structure of such a current sensor, it is preferred that the current sensor be free from a core, or be coreless. Japanese Laid-Open Patent Publication Nos. 05-223849 and 08-194016 each propose a coreless structure in which a bus bar is U-shaped to form opposing conductors through which current flows in opposite directions. A magnetic sensor is arranged at an intermediate position between the conductors.

In such a structure, the magnetic fields produced by the current that flows through the opposing conductors (i.e., the current flowing through the bus bar) is amplified at an intermediate position between the conductors. This enables the magnetic sensor to detect current without the use of a core.

However, in such a structure, the magnetic sensor is not fixed to the conductors (bus bar). The magnetic sensor and the conductors are fixed to different members. Thus, the positional relationship between the magnetic sensor and the conductors is not stable. This may result in variations in the values output from the magnetic sensor and thereby lower the detection accuracy of the magnetic sensor. Furthermore, the magnetic sensor and the conductors must be accurately positioned relative to each other in order to ensure accurate detection. Thus, the manufacturing of such a current sensor is burdensome.

SUMMARY OF THE INVENTION

The present invention provides a current sensor that improves detection accuracy.

One aspect of the present invention is a current sensor for detecting current. The current sensor includes a conductive bus bar. A fitting groove is formed in the bus bar. A package fitted into the fitting groove includes a magnetic detection element that detects current flowing through the bus bar. A lead frame connected to the magnetic detection element extends out of the package.

Another aspect of the present invention is a mounting structure for mounting a magnetic detection element on a bus bar having a fitting groove. The mounting structure has a package fittable into the fitting groove and including the magnetic detection element. A lead frame connected to the magnetic detection element extends out of the package.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
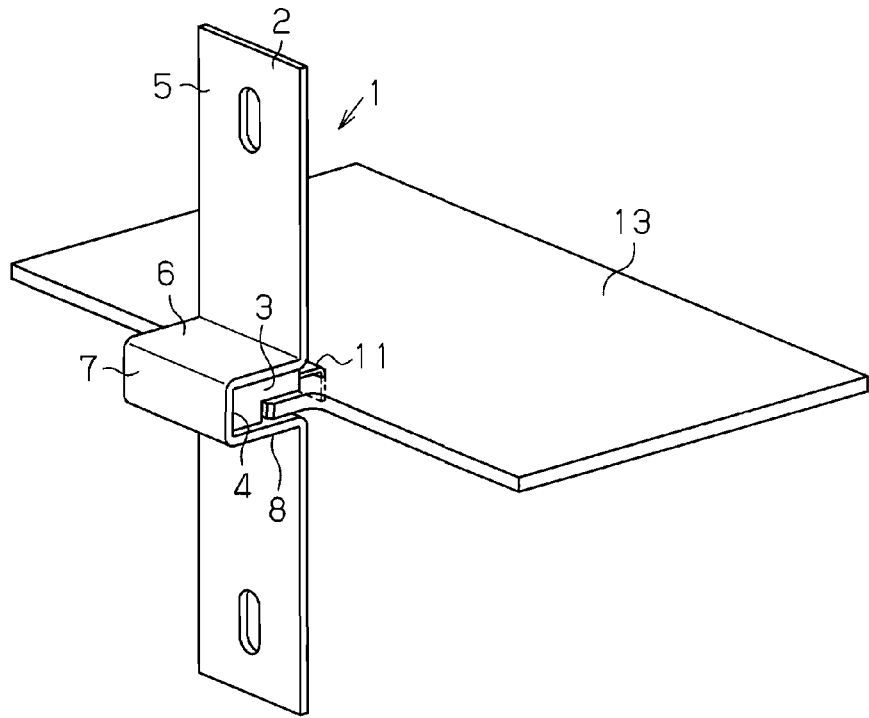
FIG. 1 is a perspective view showing a current sensor according to a preferred embodiment of the present invention.
Figure 2:
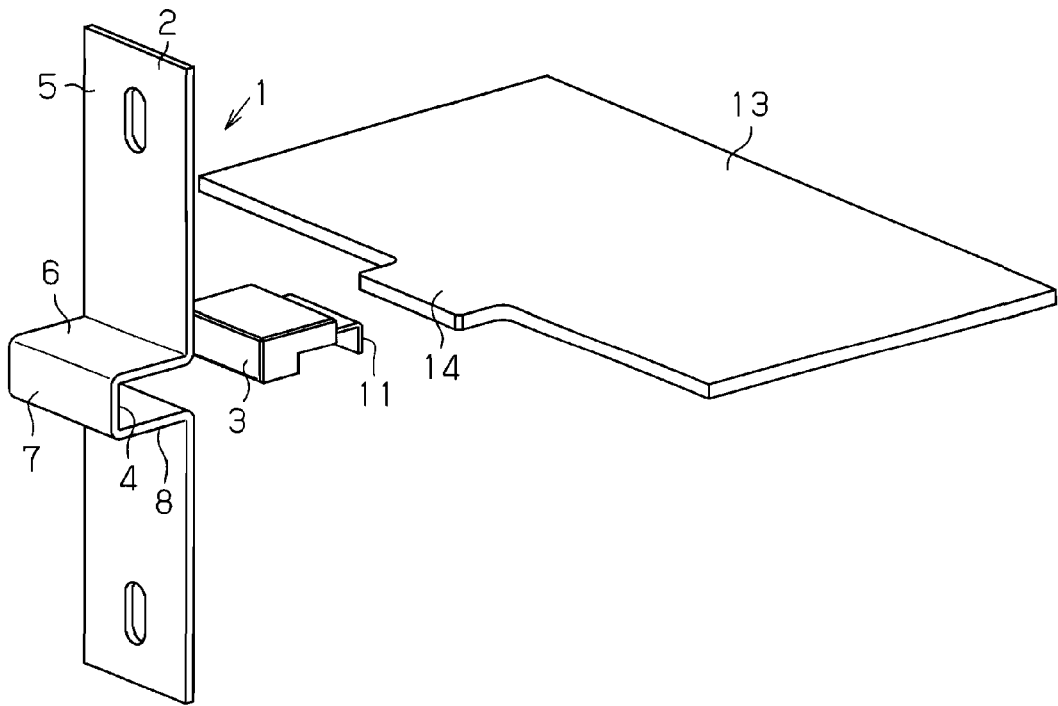
FIG. 2 is an exploded perspective view showing the current sensor of FIG. 1.

A preferred embodiment of the present invention will now be described with reference to the drawings. As shown in FIGS. 1 and 2, a current sensor 1 includes an elongated bus bar 2 and a resin package 3. The bus bar 2 is a conductive metal plate (in the preferred embodiment, copper plate). The package 3 is fixed to the bus bar 2.

The bus bar 2 includes a fitting groove 4 and a main body 5. The bus bar 2 is bent in the longitudinal direction to form the fitting groove 4, which is U-shaped. The fitting groove 4 is defined by a first conductor 6, a connection conductor 7, and a second conductor 8. The first conductor 6 extends in a direction that is orthogonal to the main body 5. The connection conductor 7 extends in a direction that is orthogonal to the first conductor 6 and parallel to the main body 5. The second conductor 8 extends in a direction that is orthogonal to the connection conductor 7 and parallel to the first conductor 6. Accordingly, the second conductor 8 faces toward the first conductor 6.

Figure 3:
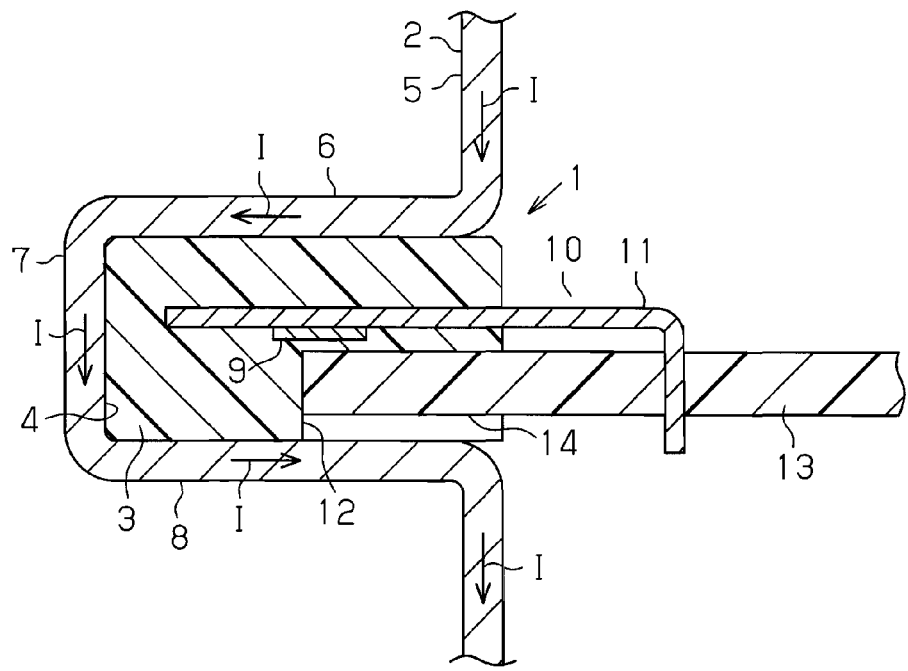
FIG. 3 is a cross-sectional view showing the current sensor of FIG. 1.

Referring to FIG. 3, a Hall element 9, which functions as a magnetic detection element, is molded in the package 3. The Hall element 9 is connected to a lead frame 10 in the package 3. The lead frame 10 has an end portion 11 extending out of the package 3. The end portion 11 is bent to be L-shaped. The Hall element 9 is arranged at an intermediate position between the first conductor 6 and the second conductor 8 in a state in which the package 3 is fitted into the fitting groove 4.

The package 3, which is shaped in general conformity with the fitting groove 4, is in planar contact with the inner surfaces of the first conductor 6, the connection conductor 7, and the second conductor 8. Further, the package 3 has a recess 12 located at the open side of the fitting groove 4 (right side as viewed in FIG. 3) in a region at the bent side of the end portion 11 of the lead frame 10 (lower side as viewed in FIG. 3).

As shown in FIGS. 1 to 3, a circuit board 13 supports the L-shaped end portion 11. The L-shaped end portion 11 extends through the circuit board 13. The circuit board 13 includes a tab 14, which is arranged in the fitting groove 4. In this embodiment, the lead frame 10 is soldered and fixed to the circuit board 13 in a state in which the tab 14 is arranged in the recess 12. Then, the package 3 and the circuit board 13 are integrally inserted into the fitting groove 4 and fixed to the bus bar 2. Although not shown in the drawings, the circuit board 13 includes an electronic control unit (ECU) to monitor the detection of the Hall element 9. The ECU is connected to the lead frame 10.

The operation of the current sensor 1 will now be discussed.

When current I flows through the bus bar 2 as shown in FIG. 3, a magnetic field is produced around the bus bar 2. As a result, the Hall element 9 outputs voltage, which is in accordance with the intensity of the magnetic field, to the ECU (not shown) in the circuit board 13. The ECU determines the value of the current flowing through the bus bar 2 based on the detection (voltage value) of the Hall element 9.

Figure 4:
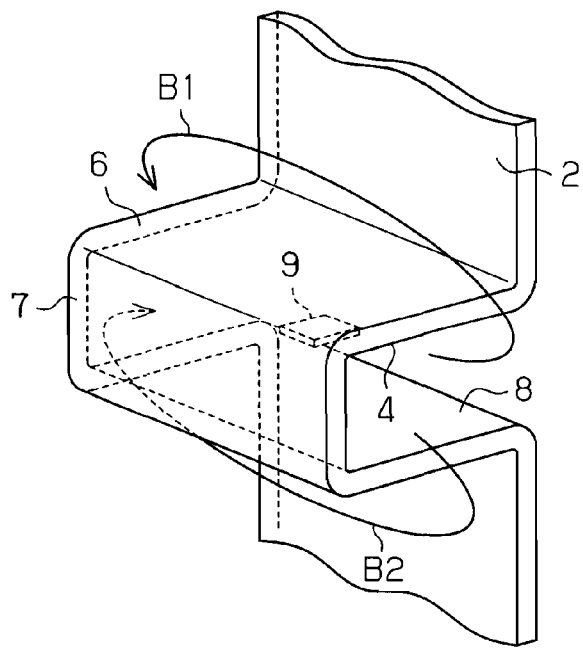
FIG. 4 is a partial perspective view showing the operation of the current sensor.

Referring to FIG. 4, when current flows through the bus bar 2, a magnetic field B1 is produced around the first conductor 6 and a magnetic field B2 is produced around the second conductor 8. Further, a synthesized magnetic field of the magnetic fields B1 and B2 are produced in the fitting groove 4 of the bus bar 2. The Hall element 9 is arranged at an intermediate position between the first conductor 6 and the second conductor 8. Thus, the magnetic field detected by the Hall element 9 (B1+B2) is two times greater than that when the bus bar 2 is straight.

If the Hall element 9 were not molded in the package 3 and the circuit board 13 were loose, the distance (gap) from the Hall element 9 to the first conductor 6 and the second conductor 8 may change. This may vary the value of the output from the Hall element 9. In such a case, the current value cannot be accurately detected.

However, in this embodiment, the Hall element 9 is molded in the package 3 to ensure that the Hall element 9 is accurately positioned relative to the bus bar 2. This prevents the output of the Hall element 9 from varying. Thus, the output of the Hall element 9 is stabilized.

The preferred embodiment has the advantages described below.

(1) The package 3, in which the Hall element 9 is molded, is fitted into and fixed to the fitting groove 4 of the bus bar 2. Thus, the position of the Hall element relative to the bus bar 2 does not change. This stabilizes the output from the Hall element 9 and improves the detection accuracy of the current sensor 1.

(2) The Hall element 9 is positioned relative to the bus bar 2 just by inserting the package 3 into the fitting groove 4 of the bus bar 2. Thus, the required detection accuracy is easily obtained.

(3) The bus bar 2 is positioned relative to the Hall element 9 in a state in which the tab 14 of the circuit board 13 is set in the recess 12 of the package 3. This prevents the circuit board 13 from becoming loose in the fitting groove 4.

(4) The tab 14, which is inserted into the fitting groove 4 of the bus bar 2, extends from the edge of the circuit board 13. Thus, the current flowing through the bus bar 2 is detected without using space in the middle of the circuit board 13, and space on the circuit board 13 is used effectively.

(5) The bus bar 2 has the fitting groove 4 to arrange the Hall element 9 between the opposing first and second conductors 6 and 8. Thus, the magnetic field produced by the current I flowing through the bus bar 2 is amplified in comparison to a magnetic field that would be produced when current flows through a straight bus bar. This enables the current sensor 1 to detect current flowing through the bus bar 2 with the Hall element 9 without the use of a core.

(6) When the Hall element 9 detects the magnetic field in the fitting groove 4 of the bus bar 2, the bus bar 2 functions to shield the fitting groove 4 from external magnetic fields. Thus, the Hall element 9 stably detects the magnetic fields that are produced when current flows through the bus bar 2.

(7) The package 3 is made of resin and thus functions as a spacer, or buffer. Accordingly, in addition to holding the Hall element 9 at the optimal position relative to the fitting groove 4, vibration resistance is improved.

(8) The package 3 is in planar contact with the inner surfaces of the fitting groove 4 (i.e., the inner surfaces of the first conductor 6, the connection conductor 7, and the second conductor 8). This increases the area of contact between the package 3 and the fitting groove 4 so that the package 3 remains stably fitted in the fitting groove 4.

It should be apparent to those skilled in the art that the present invention may be embodied in many other specific forms without departing from the spirit or scope of the invention. Particularly, it should be understood that the present invention may be embodied in the following forms.

Figure 5:
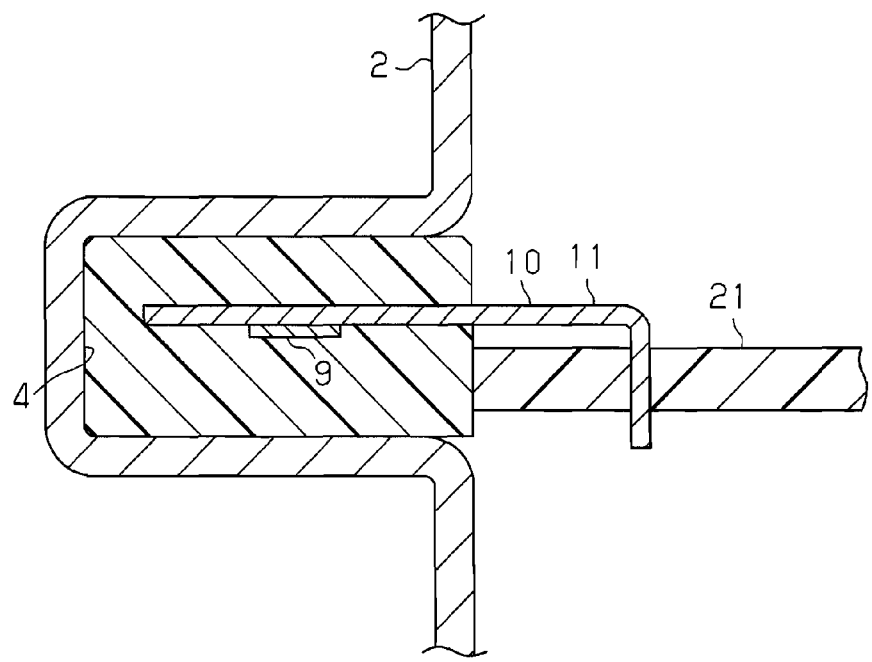
FIG. 5 is a cross-sectional view showing a current sensor according to another embodiment of the present invention.

In the preferred embodiment, the tab 14 of the circuit board 13 is inserted into the fitting groove 4 of the bus bar 2 together with the package 3. However, as shown in FIG. 5, a circuit board 21 does not have to be inserted into the fitting groove 4 of the bus bar 2. In this case, the Hall element 9 is also accurately positioned relative to the bus bar 2. Thus, the detection of the Hall element 9 is stable.

Figure 6A:
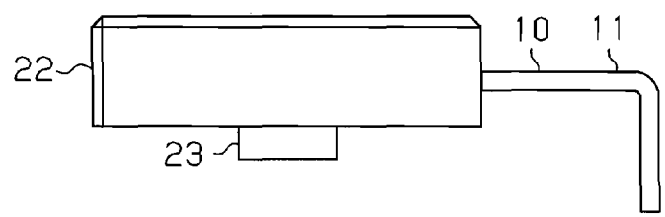
FIG. 6A is a side view and FIG. 6B is a cross-sectional view showing a current sensor according to a further embodiment of the present invention.
Figure 6B:
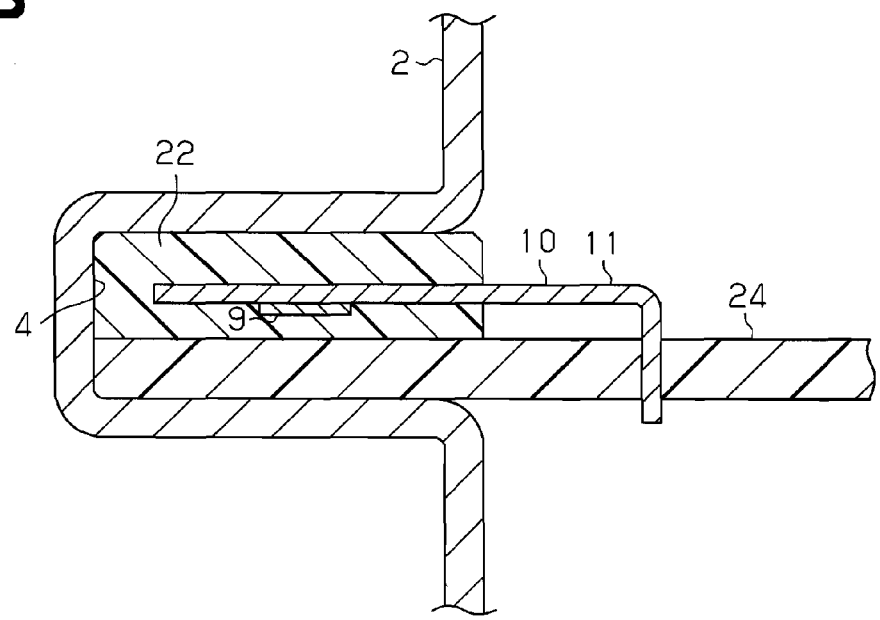

In the preferred embodiment, the circuit board 13 is inserted into the fitting groove 4 of the bus bar 2 in a state in which the circuit board 13 is set in the recess 12 of the package 3. However, the circuit board 13 and the package 3 may be fitted together into the fitting groove 4 as shown in the state of FIG. 6B. In this case, as shown in FIG. 6A, a package 22 may have a pin 23, which serves as an engaging portion. In a state in which the pin 23 is engaged with an engaging hole formed in the circuit board 13, the package 22 and the circuit board 24 may be inserted into the fitting groove 4 as shown in FIG. 6B. In this structure, the package 22 and the circuit board 24 are fitted together into the fitting groove 4 of the bus bar 2. This ensures that the circuit board 24 is fixed in the fitting groove 4 and prevents the bus bar 2 of the circuit board 24 from becoming loose. Further, the package 22 is easily positioned relative to the circuit board 24.

In the preferred embodiment, the bus bar 2 is formed from a copper plate. However, the bus bar 2 may be formed from a plate made of other metals, such as aluminum.

In the preferred embodiment, a Hall element 9 is used as the magnetic detection element. However, as long as the magnetic fields produced by the current flowing through the bus bar 2 can be detected, other elements may be used. For example, a Hall IC or a magnetic resistance element (MRE) may be used in lieu of the Hall element 9.

The present examples and embodiments are to be considered as illustrative and not restrictive, and the invention is not to be limited to the details given herein, but may be modified within the scope and equivalence of the appended claims.

What is claimed is:

1. A current sensor for detecting current, the current sensor comprising:
    a conductive bus bar;
    a fitting groove formed in the bus bar;
    a package fitted into the fitting groove and including a recess and a magnetic detection element that detects current flowing through the bus bar, wherein the magnetic detection element is molded in the package;
    a lead frame connected to the magnetic detection element and extending out of the package; and
    a circuit board supporting the lead frame, wherein the circuit board is fitted into the fitting groove together with the package in a state in which the circuit board is partially accommodated in the recess.

2. The current sensor according to claim 1, wherein the bus bar includes a first conductor and a second conductor facing toward the first conductor, with the first and second conductors defining the fitting groove, wherein the magnetic detection element is arranged between the first conductor and the second conductor in a state in which the package is fitted into the fitting groove.

3. The current sensor according to claim 2, wherein the magnetic detection element is a Hall element that detects a magnetic field produced at each of the first and second conductors.

4. The current sensor according to claim 1, wherein the circuit board includes a tab accommodated in the recess of the package.

5. The current sensor according to claim 1, wherein the package includes an engaging portion engageable with the circuit board.

6. The current sensor according to claim 1, wherein the package is formed in general conformity with the fitting groove.

7. A mounting structure for mounting a magnetic detection element on a bus bar having a fitting groove, the mounting structure comprising:
  a package fittable into the fitting groove and including the magnetic detection element and a recess, wherein the magnetic detection element is molded in the package;
  a lead frame connected to the magnetic detection element and extending out of the package; and
  a circuit board supporting the lead frame, wherein the circuit board is fittable into the fitting groove together with the package in a state in which the circuit board is partially accommodated in the recess.

8. The mounting structure according to claim 7, wherein the bus bar includes a first conductor and a second conductor facing toward the first conductor, with the first and second conductors defining the fitting groove, wherein the magnetic detection element is arranged between the first conductor and the second conductor in a state in which the package is fitted into the fitting groove.

9. The mounting structure according to claim 8, wherein the circuit board includes a tab accommodated in the recess of the package.

10. The mounting structure according to claim 8, wherein the package includes an engaging portion engageable with the circuit board.

11. The mounting structure according to claim 7, wherein the package is formed in general conformity with the fitting groove.

* * * * *